(12) United States Patent
Stutz et al.

(10) Patent No.: US 10,175,343 B2
(45) Date of Patent: Jan. 8, 2019

(54) RANGEFINDER WITH A LASER-LIKE LIGHT SOURCE

(71) Applicant: HEXAGON TECHNOLOGY CENTER GMBH, Heerbrugg (CH)

(72) Inventors: Reto Stutz, Berneck (CH); Jürg Hinderling, Marbach (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 453 days.

(21) Appl. No.: 14/958,777

(22) Filed: Dec. 3, 2015

(65) Prior Publication Data

US 2016/0161598 A1    Jun. 9, 2016

(30) Foreign Application Priority Data

Dec. 4, 2014 (EP) .................................. 14196329

(51) Int. Cl.
| | | |
|---|---|---|
| G01S 17/10 | (2006.01) | |
| G01S 17/42 | (2006.01) | |
| G01S 7/481 | (2006.01) | |
| G01S 7/484 | (2006.01) | |
| H01S 3/067 | (2006.01) | |
| H01S 5/30 | (2006.01) | |

(52) U.S. Cl.
CPC ............ *G01S 7/4814* (2013.01); *G01S 7/484* (2013.01); *G01S 7/4818* (2013.01); *G01S 17/10* (2013.01); *G01S 17/42* (2013.01); *H01S 3/06754* (2013.01); *H01S 5/3031* (2013.01)

(58) Field of Classification Search
CPC ...... G01S 7/4814; G01S 7/4818; G01S 7/484; H01S 3/06754; H01S 3/3031
See application file for complete search history.

(56) References Cited

U.S. PATENT DOCUMENTS 5,835,199 A * 11/1998 Phillips ................. G01S 7/4802
356/5.03
5,847,816 A * 12/1998 Zediker .................... G01P 3/36
356/5.09

(Continued)

FOREIGN PATENT DOCUMENTS

DE     10 2004 031097 A1    1/2006
EP           0 665 446 A2    8/1995

(Continued)

OTHER PUBLICATIONS

W. S. Heaps, Broadband lidar technique for precision CO2 measurement, Proceedings of the SPIE 7111, Lidar Technologies, Techniques, and Measurements for Atmospheric Remote Sensing IV, 711102, Oct. 15, 2008.*

(Continued)

*Primary Examiner* — Eric L Bolda
(74) *Attorney, Agent, or Firm* — Maschoff Brennan

(57) ABSTRACT

Some embodiments of the invention may relate to a rangefinder, in particular for a laser scanner, laser tracker, profiler, theodolite, or a total station. In a special embodiment of the invention, the light source of the rangefinder—provided for the emission of pulsed light signals—is configured here as an optical fiber amplifier (e.g. an EDFA, i.e. erbium-doped fiber amplifier) which is optically pumped by a superluminescent diode (SLD) operated in a pulsed manner.

23 Claims, 11 Drawing Sheets

(56) References Cited

U.S. PATENT DOCUMENTS

| | | | |
|---|---|---|---|
| 6,724,470 B2 | 4/2004 | Barenz et al. | |
| 7,297,913 B2 | 11/2007 | Tholl et al. | |
| 7,480,316 B2 | 1/2009 | Gächter et al. | |
| 7,869,469 B1* | 1/2011 | Spuler | G01S 7/4814 372/3 |
| 9,758,239 B2 | 9/2017 | Metzler et al. | |
| 2001/0009458 A1* | 7/2001 | Asaka | G01S 7/4818 356/28.5 |
| 2003/0103211 A1* | 6/2003 | Lange | G01M 11/331 356/479 |
| 2007/0002327 A1* | 1/2007 | Zhou | A61B 3/102 356/456 |
| 2007/0024956 A1* | 2/2007 | Coyle | G01S 7/4818 359/333 |
| 2007/0279615 A1* | 12/2007 | Degnan | G01S 7/499 356/4.01 |
| 2009/0316134 A1* | 12/2009 | Michael | G01C 3/08 356/4.01 |
| 2014/0163775 A1 | 6/2014 | Metzler | |
| 2016/0084651 A1 | 3/2016 | Hinderling et al. | |

FOREIGN PATENT DOCUMENTS

| | | |
|---|---|---|
| EP | 1 335 457 | 8/2003 |
| EP | 1 517 415 A1 | 3/2005 |
| EP | 1 589 353 A1 | 10/2005 |
| EP | 2 511 781 A1 | 10/2012 |
| EP | 2 998 700 B1 | 3/2016 |
| GB | 2 415 848 A | 1/2006 |

OTHER PUBLICATIONS

Dolfi-Bouteyrea et al., "Pulsed 1.5-mu m LIDAR for Axial Aircraft Wake Vortex Detection Based on High-Brightness Large-Core Fiber Amplifier", IEEE Journal of Selected Topics in Quantum Electronics, vol. 15, Issue 2, Feb. 2, 2009, pp. 441-450.

European Search Report dated Jun. 12, 2015 as received in Application No. 14196329.8.

Fulenvider et al., "Some Potential Impacts of Optical Fiber Transmission and Integrated Optics on World Communications", IEEE Intercon Conference Record Jan. 1, 1975 (Jan. 1, 1975) (Abstract only).

Rowen et al., "A combined Yb-Raman fiber amplifier for generating narrow linewidth, high-power pulses in the 1100-1200 nm wavelength range and efficient nonlinear conversion into yellow", Proc. SPIE 8601, Fiber Lasers X: Technology, Systems, and Applications, vol. 8601, Feb. 26, 2013, 8 Pages.

* cited by examiner

RANGEFINDER WITH A LASER-LIKE LIGHT SOURCE

FIELD OF THE INVENTION

The invention relates to a laser-like light source of a rangefinder, in particular for a laser scanner, a profiler or a theodolite.

BACKGROUND

Various principles and methods are known in the field of electronic or electro-optical rangefinding. One approach consists of emitting pulsed electromagnetic radiation, such as e.g. laser light, to a target to be measured, and subsequently receiving an echo from this target as back-scattering object, with the distance to the target to be measured being determined on the basis of the time-of-flight of the pulse. Such pulse time-of-flight measuring devices have in the meantime prevailed as standard solutions in many fields.

However, current rangefinders equipped with a laser light source, for example from a laser scanner with a high measurement accuracy, in particular with low distance noise, often exhibit measurement artifacts such as intensity noise within the data point clouds generated thereby, and indicate wavy, bumpy surfaces therein instead of actually present smooth, flat surfaces sampled and to be imaged. The occurrence of intensity noise of laser light emerges in a known fashion, particularly when targeting rough surfaces with laser light. The backscattered light here has grainy granulation in the brightness.

The grainy interference phenomena are denoted "speckled patterns" of scattered light or simply "speckles", which phenomena can be observed when illuminating optically rough object surfaces with sufficient coherence in both time and space for causing this phenomenon. The unevenness of the light-scattering surfaces causing this has dimensions here of an order of magnitude of between the wavelength of the laser light and a few 10 µm.

Speckles are generated when highly coherent light radiation is incident on inhomogeneous surfaces; in the current case onto objects with a rough surface; the light is subsequently transmitted or reflected and propagates in the direction of the detector. The scattered light exhibits the aforementioned granulation. The scatted radiation has an irregular field and intensity distribution and an approximately cigar-like shape in the propagation direction (regions with high energy density). Then, a granular intensity distribution is observable on the reception lens of the distance sensor. The received power, and hence the reception signal, varies irregularly when the scanner with the laser beam is moved over the object to be measured. This effect provides an unnatural brightness reproduction of the object. Moreover, the distance measurement values are noisy.

The term "speckle" is used both for an individual light spot and for the whole interference pattern. Depending on the employed imaging system, a distinction is made between "subjective" and "objective" speckles: if the speckles are imaged directly onto a screen or a camera without the aid of a lens element or other optical devices, this is referred to as "objective" speckle.

The speckle distribution or the change therein can easily be observed in the case of "objective" speckles by means of a paper sheet as a projection surface in the surroundings of the surface illuminated by the laser. The mean dimensions of the speckles in these interference patterns are primarily determined by the wavelength of the coherent excitation light, the diameter of the excitation light beam or, equivalently thereto, the size of the illuminated area and the associated geometry.

By contrast, imaging the interference pattern with the aid of an optical system—this includes the human eye—is involved in the case of "subjective" speckles. If the light pattern generated by a scattering object is imaged by means of an optical system, the speckle pattern in the image is referred to as "subjective" and the mean speckle dimension then is dependent on the optical parameters of the imaging system, such as e.g. the focal length f and the pupil diameter de.

If the light source has a plurality of modes M, for example in a manner like pulsed Fabry-Perot (FP) laser diodes, M on average independent speckle fields are created. These M fields superpose incoherently, the intensities sum and the variation of the reception signal strength when scanning the laser beam over the target object is reduced by a factor of the square root of M. In the case of a spectrally broadband light source, such as e.g. a superluminescent diode (SLD), this smoothing effect is amplified since the spectrum is broader than in the case of conventional multimode laser diodes and, moreover, the spectrum of an SLD does not have gaps.

The typical dimension of the speckles at the point of the reception pupil, but also at the field stop in the case of the reception diode, can be calculated. The mean speckle diameter is approximately:

$$d_{speckle} := \frac{\pi \cdot \lambda \cdot Dist}{d_{spot}}.$$

Here, "Dist" means the distance between the illuminated surface and the reception pupil and "$d_{spot}$" means the beam diameter on the illuminated surface.

In the case of close targets, the speckles tend to have fine granulation; this increases with increasing distance. If the measurement light of the laser is focused to infinity, it is possible to observe that the speckle dimension no longer increases anymore after a distance of a few 10 m and it assumes approximately the extent of the transmission beam in the transmission pupil.

$$d_{speckle} = d_{TX}$$

In order to be able to describe speckles quantitatively, it is necessary to consider the electromagnetic field of the light scattered back from a rough surface in more detail. Here, the electromagnetic field varies in amplitude and phase. Mathematically, such phasors are described in complex form as a combination of a real and an imaginary field component, wherein, in the simplest case, both can be assumed as distributed in accordance with a Gaussian function by way of the scattering process. The associated distributions of the magnitude of the field amplitude and the phase are Rayleigh distributions or "equal" distributions. The distribution density function of the intensity of scattered, coherent light at one point of the reception aperture is negatively exponential:

$$p(I) = \frac{1}{Im} \cdot \exp\left(\frac{-I}{Im}\right)$$

Here, "I" means intensity measured at a point and "Im" means the mean value of the intensity of the radiation field. The contrast CON of such monochromatic radiation measured with a punctiform detector is CON=1.

There are a number of conventions for defining the speckle contrast. A frequently employed one is the following, which shows the relationship with the signal-to-noise ratio:

$$\text{Contrast of the intensity: } CON := \frac{\sigma I}{\text{Im}} = \frac{1}{SNR}$$

$$\text{Reduction of the contrast: } CON = \frac{1}{\sqrt{M}}$$

In the case of monochromatic laser light, like in the case of a DFB laser diode, M=1. Therefore, the contrast CON is 100% and the intensity measured at various points scatters by 100%. This value of the normalized brightness scattering is easy to derive by means of the associated statistical distribution density of the intensity (negatively exponential distribution).

In the case of a light source with a plurality M of modes, the contrast, and hence the intensity noise, decrease proportionally to the square root of M.

In the case of such a light source with a plurality of modes M, for example in a manner like pulsed Fabry-Perot laser diodes, M on average independent speckle fields are created. These superpose mainly incoherently, the intensities sum and the variation in the reception signal strength when scanning the laser beam over the target object reduces with root M.

The following equation specifies the distribution density of the intensity at a measurement point for a light source with M modes. This equation also applies to a spatial averaging process, as occurs in the case of a large reception aperture with M lateral correlation cells, i.e. there are M speckles in the reception aperture.

$$\text{Normalized intensity: } I_k := \frac{k}{K} \quad I = [0...1]$$

$$\text{Mean intensity: } \text{Im} := 0.5$$

Distribution density as a function of the intensity $I$ and the number $M$ of modes or discrete laser wavelengths $$p(I, M) := \left(\frac{M}{\text{Im}}\right)^M \cdot \frac{I^{M-1}}{\Gamma(M)} \cdot \exp\left(-M \cdot \frac{I}{\text{Im}}\right)$$

Here, $\Gamma(M)$ denotes the gamma function.

Here, the depth roughness of the surface of the target object likewise plays a role. If the surface only has little roughness or if the transverse condition of the surface is too uniform (transverse correlation length), then the phases of the back-scattered partial waves of the electromagnetic field do not decorrelate sufficiently and the speckles indicate a residual brightness variation which lies between the exponential distribution and a Rice distribution with well-smoothed speckles.

The transverse dimension of the laser point on the target object also influences the quality of the measured point clouds. The observed dimension of the brightness spots, but also the regions of the distance errors (<0.5 mm), even if these are only small, when measuring homogeneous surfaces also have a relationship with the dimension of the laser point on the scanned object. In the case of an object scan, the laser beam is scanned over the surface, with the speckle pattern changing on the detector of the distance measurement sensor. The speckle pattern appears to change continuously but fluidly. The form of the pattern is decorrelated as soon as the laser measurement spot on the object has moved by one beam cross-section. Since a systematic distance measurement deviation is also linked to the speckle distribution, the measured surface exhibits a wavy distance deviation (bumpy surfaces).

In accordance with the prior art, distance measurement sensors for geodetic or industrial surveying instruments are generally equipped with a laser as light source. The following are typically used as lasers:

Laser diodes and solid-state lasers, in each case embodied with single mode or multi-mode spectra, wherein the multi-mode spectra typically have a width of approximately 1.5 nm;

So-called "seeded fiber amplifiers" (i.e. light fiber amplifiers amplifying the light from an excitation light source);

Fiber lasers;

"High radiance LEDs" (light-emitting high power diodes).

Apart from the LEDs, all of the aforementioned light sources are connected with the disadvantage of a pronounced granular intensity distribution of the light scattered back from naturally scattering or reflecting surfaces. "High radiance LEDs" have the disadvantage of a low beam density and are therefore not used for measurements on diffusely scattering targets. The modulation speed of LEDs is also limited. The shortest signal increase times are of the order of a few nanoseconds. As a result of a too low modulation bandwidth, such diodes are no longer used for signal-sensitive rangefinders with a high accuracy.

Since speckles are a special phenomenon of spatially and time-coherent illumination, the speckle contrast and speckle influence can be reduced by various measures. By way of example, the following techniques are known for reducing speckles:

moving the transmission light spot on the target object;
moving the reception lens radially;
moving or vibrating a diffuser in the transmission beam across the beam direction;
using a diffuser with a small scattering angle;
using two diffusers in the transmission channel with the counter-directed movement thereof across the laser beam;
using "polarization diversity", i.e. simultaneous emission of light with various polarization states.

Since the light spot on the target object should be as small as possible, a reduction of the spatial coherence is generally not possible provided the object is not arranged very close and the transmission optical unit is focusable in such a way that the light spot maintains a sufficiently small extent on the target object. (The phrase "sufficiently small extent" in this case should be understood to mean a dimension which is still much larger than the diffraction limit of the light).

On the other hand, a time-dynamic diffuser can reduce the spatial coherence. Here, for example, the dynamic diffuser can be embodied as a moved hologram, a vibrating phase object, a liquid crystal, as an optical phase shifter or as an EO phase modulator. However, a disadvantage of all these processes is that these increase the beam divergence. In particular, a constant phase shift across the whole beam cross section is not expedient in the diffraction far field due to the structures of the speckles which are elongate in the scattering direction.

Some methods are connected with time averaging of speckle fields, for the purposes of which a certain amount of integration time is required. However, since scanning is used as a very quick measurement process with a measurement rate of typically 1 Mpts/s or more, these averaging processes are not employable.

As a further process, a speckle reduction can be obtained by observing/measuring an extended reception aperture in the case where more than one speckle is covered by the reception aperture. The graininess of the light spot at the detector surface becomes finer using an integrated intensity over a plurality of speckles. This intensity integrated at the reception diode has a reduced variation in the intensity.

However, since the size of modern surveying instruments is becoming ever smaller, effective averaging on its own, and hence the speckle reduction, is insufficient.

SUMMARY

Some embodiments of the invention include providing a light source for a surveying instrument, in particular a laser scanner, a profiler or a theodolite, by means of which the disadvantages connected with a highly coherent light source, in particular the generation of speckles and falsification of distance measurements and images of an object surface to be measured resulting therefrom, are avoided or at least minimized and by means of which a measured distance noise is minimized. Here, another embodiment of the invention may include to simultaneously enable a highly precise measurement of the surface.

Some embodiments of the invention include suppressing speckle-induced intensity noise in order to obtain an image which is as close as possible to reality with a non-falsified brightness distribution of the object.

The invention relates to an electro-optical rangefinder for a surveying instrument, in particular for a laser scanner, laser tracker, profiler, theodolite or total station.

In this case, the rangefinder comprises light emission means for emitting at least one light signal, in particular for emitting a light pulse, and a receiver for detecting the light signal scattered back from a target object. The distance to the target object is determined using a control and evaluation component, for example on the basis of the pulse time-of-flight measurement method.

In contrast to the prior art, the light emission means according to the invention are constructed from at least one spectrally broadband light source (i.e. a semiconductor component emitting spectrally broadband light) as a primary light source and an optical amplifier disposed downstream of the primary light source, for which the primary light source therefore serves as seed source.

In particular, an actively pumped medium of the optical amplifier serves as a light amplifier without a resonator (i.e. there is no optical resonator). Here, the optical amplifier can be provided and embodied to be operated with a modulation sequence with a short and/or long duty cycle.

According to the invention, the seed source for the optical amplifier (which, in particular, is embodied as a fiber amplifier) can advantageously be a superluminescent diode (SLD) with a spectral width of between 7 nm and 50 nm (in particular, wherein the spectrum is then covered substantially without gaps within this width).

Thus—in general—the primary light source which comes into question as seed for the optical amplifier can, in particular, be a diode (e.g. superluminescent diode or high radiance LED), which is similar to a laser diode in terms of design but embodied without laser resonator (or cavity).

However, alternatively, it is also possible, according to the invention, to use a multimode laser diode as a primary light source (i.e. as seed for the optical amplifier) (e.g. a Fabry-Perot laser diode with multimode emission). Thus, in particular, the primary light source can be embodied as a semiconductor laser diode which emits a plurality of modes and polychromatic light with a plurality of spectral lines. Specifically, the primary light source can also be embodied as a broad stripe laser diode or VCSEL (vertical cavity surface emitting laser) laser diode, which emits spatially multimode and polychromatic light, in particular with a spatial emission width of between 10 μm and 300 μm.

Within the scope of the invention, the primary light source of the distance measurement light emission means employed can—in accordance with a first option—respectively be directly modulated itself (i.e. directly controlled electrically by the corresponding electric current by means of which the employed light-emitting semiconductor component is operated). However, on the other hand, it is also possible to use an external modulation, wherein the emitting diode (i.e. the primary seed light source) is operated in continuous mode and the emitted light is then optically modulated by an "external instrument" (such as e.g. an acousto-optical modulator AOM or electro-optical modulator EOM) (cf., for example, "externally modulated LED").

By way of example, the light pulses required for a pulse time-of-flight measurement can then be generated by both modulation options, in particular—for example—wherein, as a result thereof, pulses are then emitted with a repetition rate of between 500 kHz and 10 MHz.

Furthermore, the seed light source can for example also be operated in a burst mode, wherein, as a result thereof, a reduction of the influence of the chromatic delay on the distance measurement is obtainable.

According to the invention, in order to ensure the highest possible local measurement resolution, it is in particular those light sources that come into question for the distance measurement which emit in a spatial single-mode manner or in a mode combination which approximately corresponds to a profile of a TEM00 mode. Instances of time averaging are also sophisticated so as also to enable a quick measurement with a measurement rate of one megahertz or more. If, moreover, each measurement point on the target object is still intended to be recorded by means of a single laser pulse, then it is only possible to contemplate a time-parallel process for reducing the speckle contrast or speckle noise.

In accordance with the concept according to the invention, this is achievable by a significant spectral broadening of the light source (compared to conventional laser sources emitting coherent light).

In particular, as already mentioned previously, a superluminescent diode (SLD) should, according to the invention, be used as primary seed light source. Depending on the type, the spectral widths are between 7 nm and 50 nm. The choice of an SLD, in which the spectrum exhibits no gaps, as a result of which a particularly efficient noise suppression of the speckles is made possible, is particularly advantageous in this case.

However, as sole light sources, SLD light sources are not sufficiently powerful for an application in distance measurement technology. The currently strongest light sources achieve less than 50 milliwatt. By contrast, regular laser diodes achieve powers up to watt, broad stripe lasers achieve powers up to several 100 watt and VCSEL arrays achieve powers of more than 1000 watt.

According to the invention, in order to ensure that the light emission means generate a sufficiently high power, an optical amplifier is disposed downstream of the SLD.

Essentially, three types of optical amplifiers are available:
Fiber amplifiers, doped with a rare earth metal (YDFA, EDFA, . . . );
Fiber-based Raman amplifiers (SiO$_2$, . . . );
Semiconductor amplifiers (SOA);
Crystal amplifiers such as regenerative amplifiers and optical parametric amplifiers (OPA).

In principle, according to the invention, actively pumped media without resonators can serve as light amplifiers.

The most efficient amplifiers are glasses or crystals doped with rare earth metals. Raman amplifiers have an amplification that is less by approximately 20 dB and are therefore less suitable; the semiconductor-based (InGaP, GaAs, InGaAs, . . . ) amplifiers (SOA) are not sufficiently strong for pulsed operation with a short duty cycle either. A special variant of the amplifiers based on rare earths are the optical fiber amplifiers. These are particularly efficient and have a compact form.

According to the invention, an SLD as primary light source is therefore preferably combined with a fiber amplifier. Here, Y, Yb, Pr, Ho, Tm or Er can be used as dopant. Co-doping is also possible, for example with Pr and Ho. Using this, amplification in additional wavelength ranges is achievable.

Advantageously, it is possible to select such a fiber amplifier which has a fiber core diameter that is greater than the diffraction limit, in particular with a so-called "large core" fiber. Hence, the light emitted by a seed source with a large emission surface (i.e. light, which is emitted by a primary light source with a large emission surface) can also be efficiently coupled into the amplifier.

Some embodiments of the present invention may include light emission means with a combination of an SLD (or an area-emitting high radiance LED) and a fiber amplifier and may in particular offer the following advantages:
performance, spectrally incoherent light source;
reduction in the brightness contrast of the speckle field;
better statistical distribution or averaging of the modulation errors in respect of both spectral and spatial distributions; this both in the case of "TOF" and phase-like modulations.

Here, a "TOF" modulation is understood to be a modulation with single shots or a few shots per measurement point with a small duty cycle between the burst packets or modulation pulses (for a distance measurement according to the pulse time-of-flight principle). Here, a "phase" modulation is understood to mean a modulation with continuous wave-like, periodic or pseudo-periodic shots with a large duty cycle, i.e. small pauses, between the modulation pulses (for distance measurement which, in principle, is brought about according to the principle of the phase measurement).

A plurality of SLDs can also be disposed upstream of the fiber amplifier as seed.

From this, e.g., the following effects emerge:
no, or merely weak, speckles, a smaller intensity distribution, more natural intensity images;
no "bumpy surfaces" of objects; as a result of this, in particular, also less distance noise.

Even in the case of surfaces with a low roughness, this still has a good, i.e. high, signal-to-noise ratio (SNR). This is because the correlation among the back-scattered radiation (phasors of the scattered spherical or dipole waves) increases with decreasing standard deviation of the roughness. However, the broad spectrum of the light source according to the invention counteracts this correlation.

An alternative or additional or complementary measure according to the invention for reducing the contrast relates to speckles in the reception pupil of the rangefinder.

The mean speckle diameter $d_{speckle}$ at the location of the reception pupil is approximately:

$$d_{speckle} := \frac{\pi \cdot \lambda \cdot Dist}{d_{spot}}.$$

If the measurement light of the laser is focused to infinity, it is possible to observe that the speckle dimension $d_{speckle}$ no longer increases anymore after a distance of a few 10 m and it assumes approximately the extent of the transmission pupil $d_{TX}$.

$$d_{speckle} = d_{TX}$$

Therefore, a speckle reduction can be achieved by using a reception aperture (RX aperture) that is much larger than the transmission aperture (TX aperture). The many speckles captured simultaneously thereby contribute to an averaging of the intensity. By way of example, if M speckles are directed onto the detector, the scattering of the signal reduces with the square root of M. If the reception optical unit is focused not onto the target object but onto an infinitely large distance, many scattering agents of the rough surface are within the Airy resolution of the point spread function of the reception optical unit. As a result, the whole transmission light spot becomes visible on the target object and a larger area or extent contributes to possible phase decorrelation. As a result of the extended field of view, the area illuminated overall and hence a larger number of laterally decorrelated scattering agents at the object contribute to the space point formed by the detector. Hence, there is an averaging process of the speckle-caused signal variation.

A combination of the two inventive steps (SLD/LED and large reception aperture) generates a reception signal with less noise and a good signal-to-noise ratio, in particular due to, firstly, a reduced granulation of the stray field and, secondly, a reduced intensity noise as a result of additional averaging on the detector.

The intensity scattering on the receiver reduces with an increasing number of laser modes or spectral lines. This can be seen by narrower distribution curves in intensity histograms, which are placed ever more tightly around the mean intensity.

According to the invention, an approach for reducing contrast emerges from this fact: this is because a statistically comparable averaging effect is also generated when receiving a number of speckles simultaneously by means of a large receiver area, as already described above.

An integrating effect over the speckles incident in the reception lens is generated with an increasing number of speckles in the reception pupil. As a result, the brightness variation of the reception signal is reduced. Hence, the speckle contrast is also reduced and the signal variation weakens.

The statistical calculation of the associated contrast function leads to the same formula as specified above; here, M represents the number of speckles in the reception pupil or on the field stop (M=number of speckle correlation cells within the measurement reception aperture).

Therefore, in accordance with one embodiment, the distance measuring device according to the invention is equipped with a reception aperture or reception pupil that is as large as possible compared to the transmission aperture. What this ensures is that, to a first approximation, a large number M of speckles are received practically independently of the distance range. As a result, the speckle contrast is reduced or, equivalently, the signal-to-noise ratio (SNR) is increased. Using this measure, more natural images with low brightness variations are measured. The distance measurement also exhibits smaller variations in the registered distance values.

The roughness of the objects also influences the brightness distribution of the speckles. The rougher the surface, the more uniform the reception light, but only up to a certain limit which precisely also depends on the polychroism of the light source and the size of the reception aperture.

The transverse dimension of the laser point at the target object also influences the quality of the measured coordinates and hence of the point clouds.

This can be explained as follows: the pulsed, or otherwise modulated, light sources of rangefinders have a so-called chromatic delay. This delay describes the distance offset as a function of the light source wavelength. Since each mode or each wavelength generates its associated speckle field and the speckle distribution also depends on the roughness of the irradiated surface, there is also an influence on the distance offset. Hence, the wave-like distance deviations are generated by way of the chromatic delay and the respective speckle distribution. If the laser point is now displaced over the target object by at least one beam diameter, a newly structured granular light field and hence a distance deviation which is uncorrelated to the preceding measurement are created.

Using the light source according to the invention for rangefinders, which comprises an SLD and a fiber amplifier in a special embodiment, both the intensity variations of the speckles and the effect in relation to the generation of the wave-like distance deviations are strongly weakened. The spectral width $\Delta\lambda$ of an SLD is substantially approximately 10 times wider than that of laser diodes. Moreover, the spectrum is without interruptions. This continuity increases the reduction in the speckle contrast.

For an exemplary calculation, the following parameters are assumed:

$$\lambda_o := 660 \cdot 10^{-9} \; \Delta\lambda := 30 \cdot 10^{-9} \; \sigma h := 500 \cdot 10^{-6}$$

Here, $\lambda_o$ is the mean wavelength, $\Delta\lambda$ is the spectral width of the light source and $\sigma h$ is the depth roughness of the target surface.

Hence, the following emerges as a brightness contrast:

$$CON := \sqrt{\frac{1}{4 \cdot \pi} \cdot \frac{\lambda_o}{\Delta\lambda} \cdot \frac{\lambda_o}{\sigma h}} = 0.048$$

Thus, the intensity variation is only 4.8% instead of 100% for highly coherent radiation.

The approximation formula above applies for an assumed Gaussian-distributed spectrum and an assumed Gaussian-distributed roughness of the surface. The formula also shows for the case of a spectrally broadband ($\Delta\lambda$) light source such as the SLD that, in turn, the surface roughness $\sigma h$ also contributes to reducing the contrast.

If the SLD is modulated by sub-nanosecond pulses, then the chromatic delay, which also influences the absolute distance measurement accuracy, is also small. As a result, no, or at least strongly attenuated, wave-like distance deviations can be obtained.

Surprisingly, the spatial coherence at the location of the detector does not disappear in the limit case of a white-light source. The remaining spatial contrast function (visibility) is described by the Van Cittert-Zernike theorem known from astronomy. The arrangement according to the invention is characterized by a middling situation between this incoherent illumination and a coherent illumination.

BRIEF DESCRIPTION OF THE DRAWINGS

Below, the invention is described in more detail in a purely exemplary manner on the basis of specific exemplary embodiments depicted schematically in the drawings, with further advantages of the invention also being discussed. In detail:

FIG. 7b shows the frequency distribution of the intensity of the speckles associated with FIG. 7a;

FIG. 11 shows an illustration in respect of the generation of the so-called "chromatic delay" or "chromatic distance offset" of a modulated light source as a mechanism for the generation of "bumpy surfaces" with a light source, the spectrum of which was depicted in an exemplary manner in FIG. 9a;

DETAILED DESCRIPTION

Figure 1:
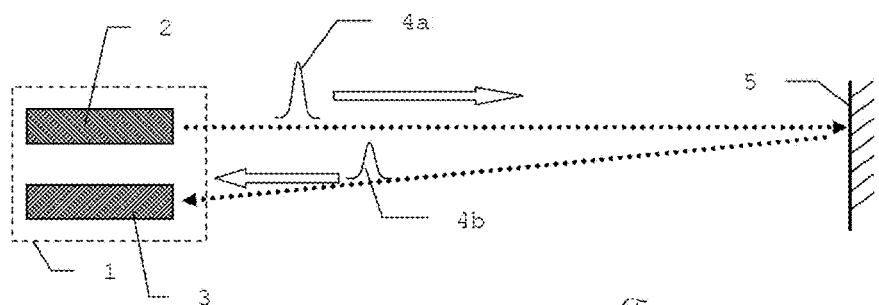
FIG. 1 shows a schematic diagram of an electro-optical rangefinder.

FIG. 1 shows a schematic diagram of an electro-optical rangefinder 1 according to the pulse time-of-flight principle. Arranged in the rangefinder 1 are light emission means 2 and a receiver 3. The transmitter 2 emits a light pulse 4a, which is detected again by the receiver 3 as a back-scattered light pulse 4b after reflection or back-scattering at a target 5, e.g. an object surface. According to the invention, a continuously modulated transmission signal can also be used instead of the light pulses.

Here—as is sufficiently well known from the prior art—the receiver 3 can be constructed with a detector, e.g. an avalanche photodiode (APD), and signal processing electronics disposed downstream of the detector.

In a special embodiment, the design can also furthermore have a reception diode consisting of a plurality of segments, in particular a multi-segment PIN diode or APD. Such a design of the reception diode for a rangefinder is described, for example, in the European patent application with the application number EP14185404.2 (filed at the EPO on 18 Sep. 2014).

As is likewise, in principle, already known from the prior art, the receiver (i.e. the optical reception path) can be equipped either with a fixed focus or with an autofocus.

Figure 2:
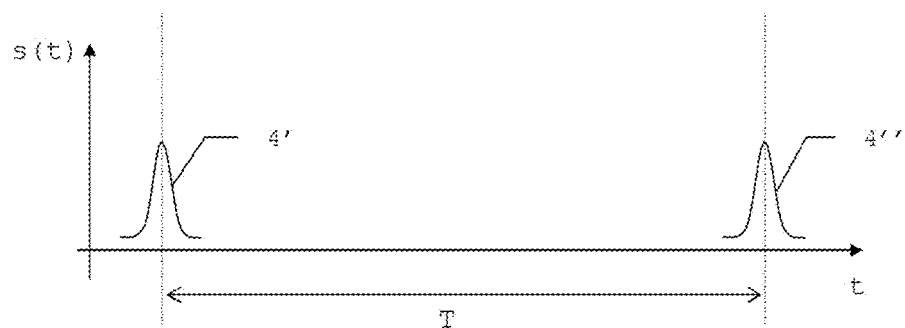
FIG. 2 shows a schematic diagram of a time-of-flight measurement method according to the prior art.

As explained in the schematic diagram in FIG. 2, the distance—as is known per se—can be established from the time-of-flight T as a time difference between the start time S of the emission of a light pulse 4' and the reception time of the back-scattered light pulse 4" (with this being performed by the control and evaluation component). Here, the reception time is established by evaluating a feature of the signal pulse s(t), e.g. by a signal threshold being exceeded or by a centroid of the integrated pulse profile being determined. As mentioned, other processes for measuring the time-of-flight T are also usable in the threshold method, such as e.g. converting the reception signal into a bipolar signal and subsequently determining the zero crossing.

Figure 3:
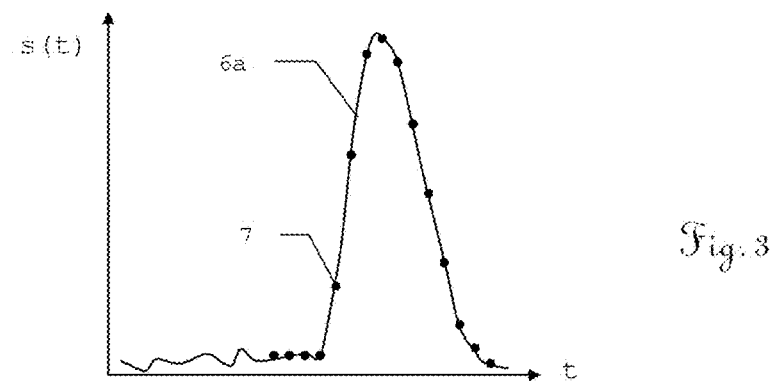
FIG. 3 shows a schematic diagram of a sampling method for back-scattered light signals according to the prior art.

FIG. 3 elucidates the principle of a sampling method for back-scattered light signals according to the prior art. A received signal 6a or the signal profile thereof is sampled at different times 7 or assigned time intervals such that the signal form can be derived. As a result, it may be possible (for determining the time-of-flight) to derive the emission time and the reception time more precisely and in a manner that is better comparable.

Figure 4:
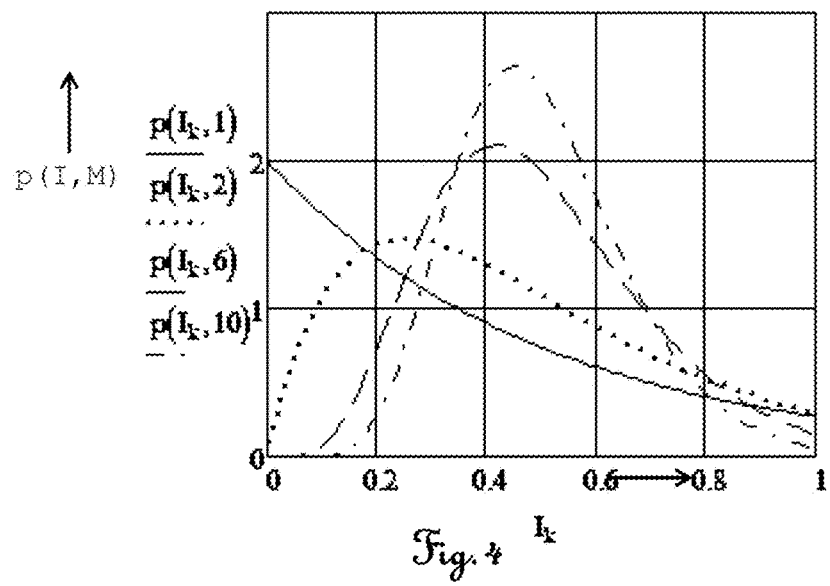
FIG. 4 shows the profile of the distribution density as a function of the normalized intensity $I_k$ for single mode, dual-mode, six mode and ten mode lasers (M discrete laser wavelengths) as an illustration of an option for reducing the speckle contrast in the case of polychromatic light sources.

FIG. 4 illustrates an option for speckle contrast reduction in the case of polychromatic light sources.

If the light source has a plurality of modes M, for example in a manner like pulsed Fabry-Perot laser diodes, then M on average independent speckle fields are generated. These superpose incoherently, the intensities sum and the variation of the reception signal strength when scanning the laser beam over the target object is reduced by the square root of M.

FIG. 4 shows the profile of the distribution density p(I,M) as a function of the normalized intensity $I_k$ for one, two, six and 10 modes or discrete laser wavelengths M.

The distribution density is calculated as follows:

Normalized intensity: $I_k := \dfrac{k}{K}$

Mean intensity: $Im := 0.5$

Distribution density as a function of the intensity $I$ and the number $M$ of modes or discrete laser wavelengths $$p(I, M) := \left(\dfrac{M}{Im}\right)^M \cdot \dfrac{I^{M-1}}{\Gamma(M)} \cdot \exp\left(-M \cdot \dfrac{I}{Im}\right)$$

The intensity scattering on the receiver reduces with an increasing number of laser modes or spectral lines.

This is visible from narrower distribution curves, which are placed ever tighter around the mean intensity.

Figure 5:
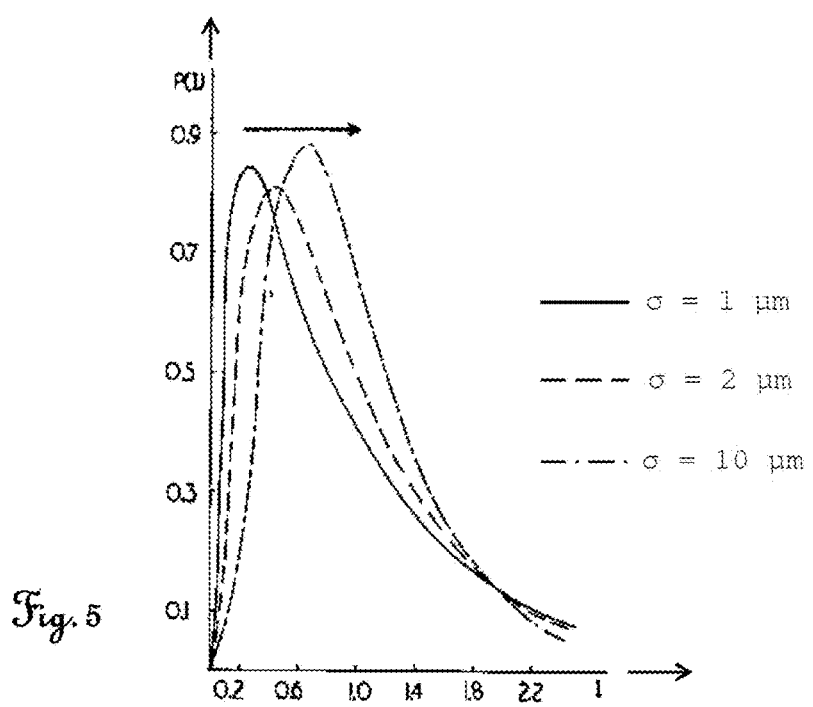
FIG. 5 shows probabilities of the brightness distribution p(I) for different degrees of surface roughness $\sigma$.

FIG. 5 shows probabilities of the brightness distribution P(I) for different degrees of surface roughness σ. The arrow in the center of the graphic elucidates the shift of the distribution maximum when the roughness increases. Moreover, a type of saturation effect can be seen, in which there is no further decrease in the intensity contrast in the case of a further increase in the roughness of the surface. The reason for this lies in the restricted polychroism of the light source. For this graphic, a light source with only 6 wavelengths was assumed; hence, the averaging process only comprises 6 summands.

The roughness of the objects therefore influences the brightness distribution of the speckles. Increasing roughness of the surface is accompanied by a more uniform reception light, but only up to a certain limit which precisely also depends on the polychroism of the light source and the size of the reception aperture.

Figure 6:
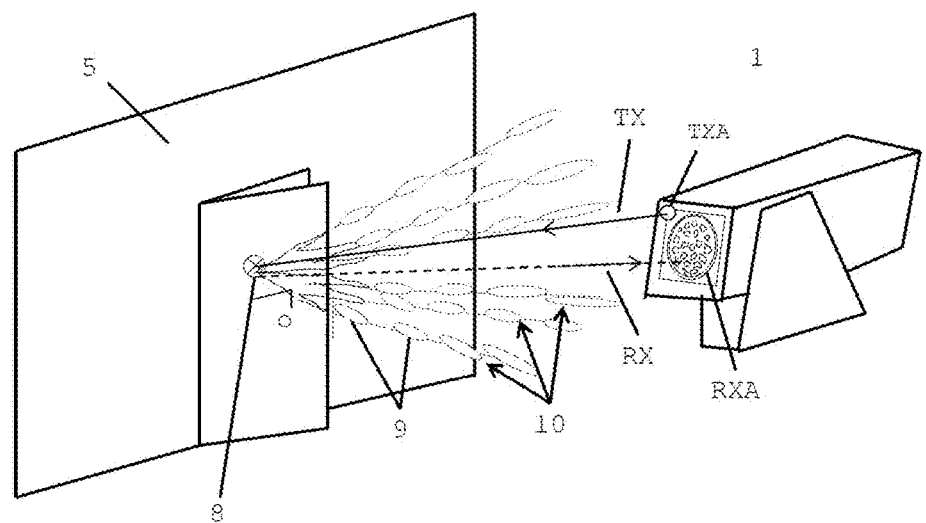
FIG. 6 shows a typical measurement arrangement using a rangefinder according to the prior art.

FIG. 6 shows a typical measurement arrangement using a rangefinder 1 according to the prior art. From a transmission aperture TXA thereof, the rangefinder 1 emits a transmission beam TX of coherent measurement light in the direction of an object 5 to be measured, as a result of which a light spot 8 of the impinging measurement light is generated there. The light RX, reflected by the object, for the distance measurement has a multiplicity of speckles 9, which generate a speckle field 10 in space which impinges on the reception aperture RXA of the rangefinder 1 with a granular intensity distribution.

FIGS. 7a to 7e illustrate typical speckle patterns at the reception lens of the rangefinder in the case of different target or object distances.

Figure 7A:
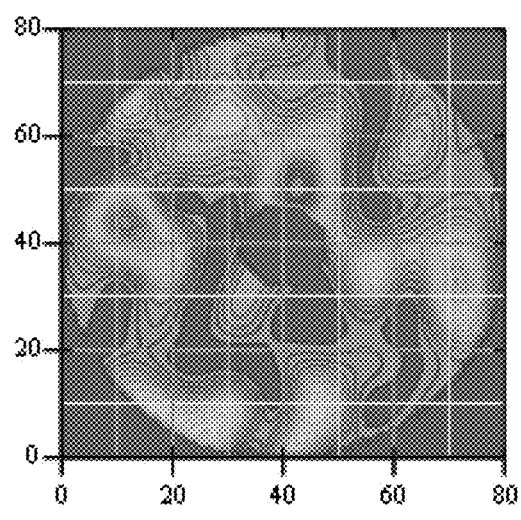
FIG. 7a shows the speckle distribution which emerges for a monochromatic measurement light source at a distance of 15 m from a light-scattering object in the cross-sectional plane of the reception lens of the rangefinder.

Here, FIG. 7a shows the speckle distribution which emerges for a monochromatic measurement light source at a distance of 15 m from the light-scattering object in the cross-sectional plane of the reception lens. There are a number of points without light. In the case of monochromatic illumination, these are even the most frequent.

Figure 7B:
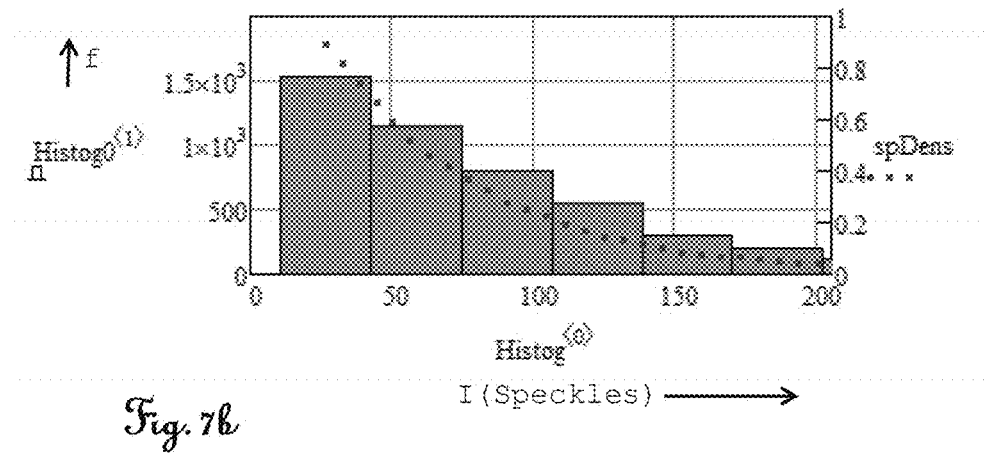

FIG. 7b shows the associated frequency distribution f of the intensity I(speckles) of the speckles. The frequency of the intensity values "measured" over the receiver area is negatively exponential, as is typical for quasi-monochromatic light. Such a distribution has contrast values around 100%. The bars are values from a simulation in relation to the image data from FIG. 7a, and the points follow a profile in accordance with a theoretical exponential distribution.

Figure 7C:
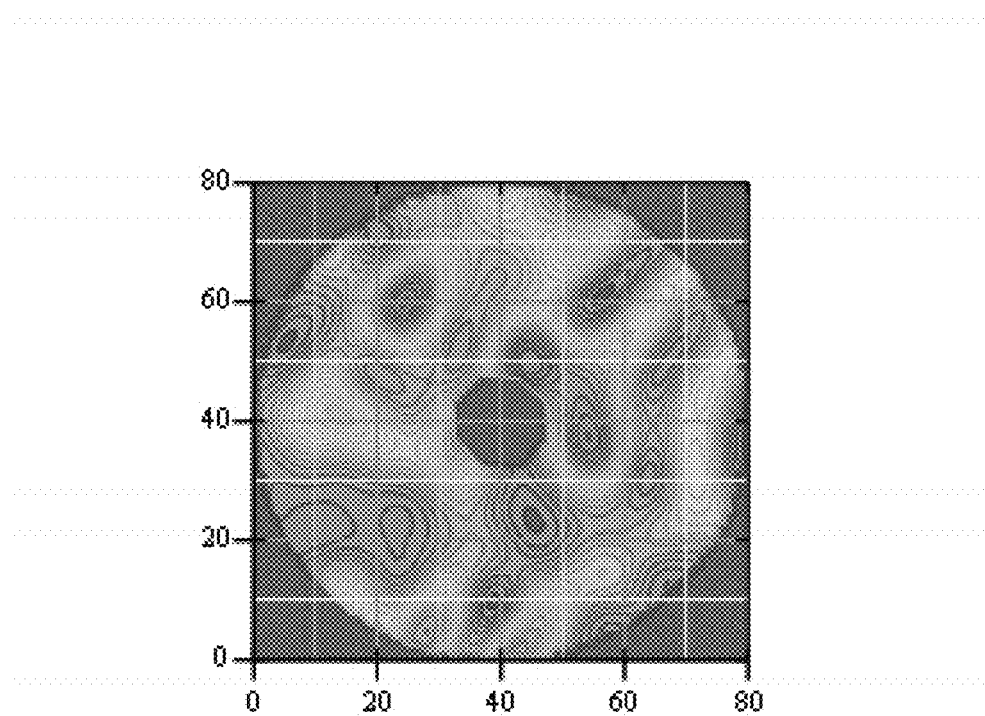
FIG. 7c shows, in an illustration analogous to FIG. 7a, the speckle distribution which emerges for a polychromatic measurement light source with 5 laser modes at a distance of 15 m from the light-scattering object in the cross-sectional plane of the reception lens.

FIG. 7c shows, in an illustration analogous to FIG. 7a, the speckle distribution which emerges for a polychromatic measurement light source with 5 laser modes at a distance of 15 m from the light-scattering object in the cross-sectional plane of the reception lens. Compared to FIG. 7a, it is particularly conspicuous that there are hardly any points without light anymore.

Figure 7D:
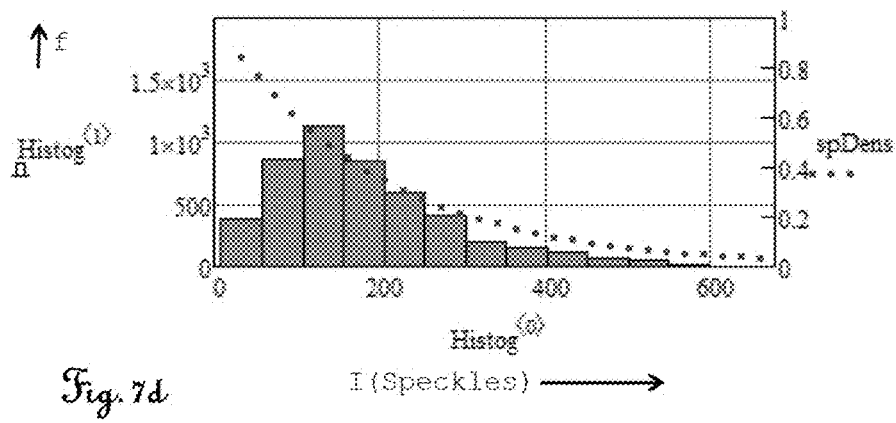
FIG. 7d shows the frequency distribution of the speckles belonging to the image data from FIG. 7c.

Quantitatively, this impression is confirmed by the frequency distribution of the speckles in FIG. 7d belonging to the image data of FIG. 7c. It now clearly deviates from the exponential distribution (for monochromatic light) indicated by the dots, particularly in the region of low intensity values. Instead, the distribution approaches a Gaussian curve: the variations of the brightness group about a mean brightness value and the scattering along the horizontal axis becomes smaller than in comparison with monochromatic light. Points without light are now no longer probable. The brightness contrast CON expected under 5 laser modes is 45% and therefore substantially smaller than 100%. The bars are correspondingly values from the simulation in relation to FIG. 7c.

Figure 7E:
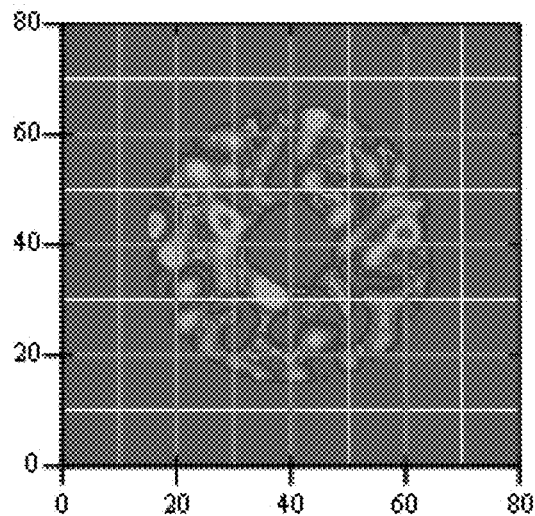
FIG. 7e shows, for comparison with FIG. 7a, the speckle distribution which emerges for a monochromatic measurement light source at a distance of 5 m from the light-scattering object in the cross-sectional plane of the reception lens.

FIG. 7e shows, for comparison with FIG. 7a, the speckle distribution which emerges for a monochromatic measurement light source at a distance of 5 m from the light-scattering object in the cross-sectional plane of the reception lens. This simulation image shows that the speckle dimension on the receiver surface becomes smaller with decreasing distance. The influence of the speckles can thus also depend on the distance from the light-scattering object.

Figure 8:
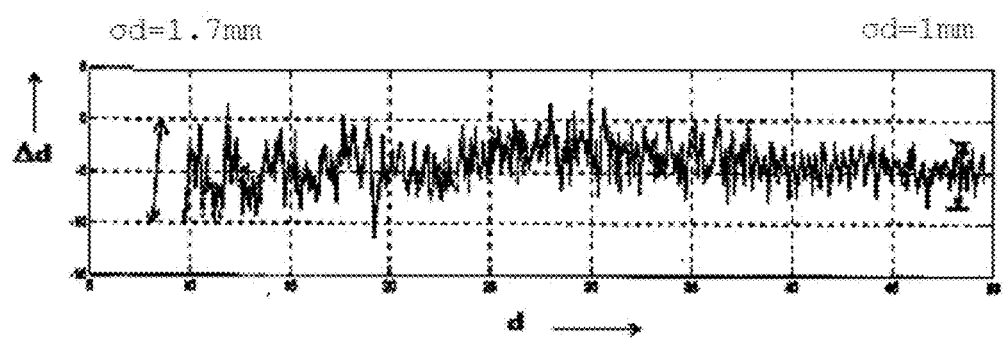
FIG. 8 shows the apparent offset and the scattering of the distance values derived from the image evaluation as a function of the measurement distance from the light-scattering object in accordance with a measurement arrangement with a monochromatic light source, by means of which the speckle distributions as depicted in FIGS. 7a, 7c and 7e are observed.

FIG. 8 shows the apparent offset $\Delta d$ and the scattering $\sigma d$ of the distance values derived from the image evaluation as a function of the measurement distance d from the light-scattering object in accordance with a measurement arrangement with a monochromatic light source, by means of which the speckle distributions as depicted in FIGS. 7a, 7c and 7e are observed. The distance noise $\sigma d$ is of the order of 1 mm and decreases with increasing distance in this arrangement.

Figure 9A:
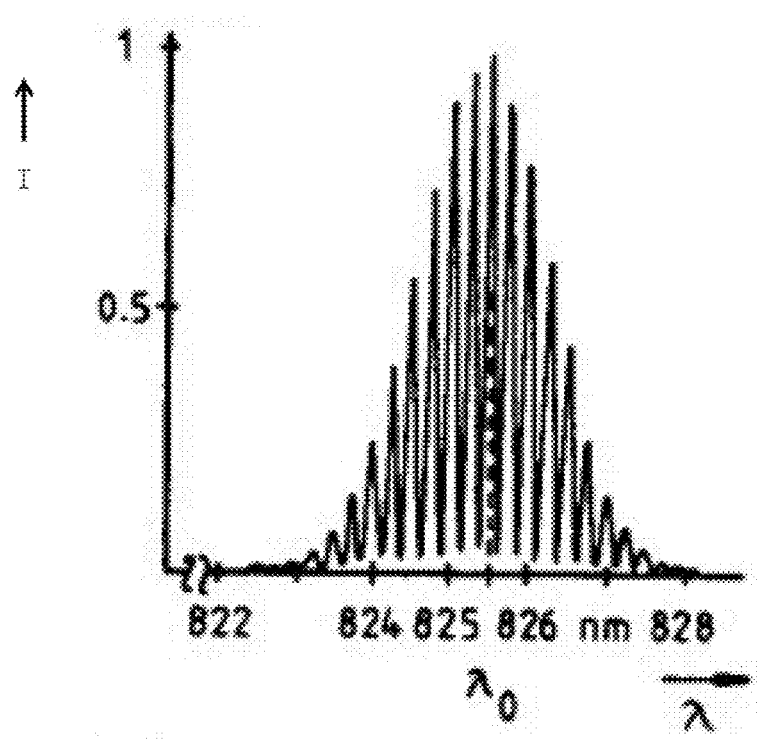
FIG. 9a shows a spectrum of an FP (Fabry-Perot) laser diode in the case of a multimodal emission and pulsed method of operation.

FIG. 9a shows a typical spectrum of an FP laser diode in the case of a multimodal emission and pulsed method of operation. Essentially, the spectrum has approximately M=10 longitudinal modes. Here, the emitted central wavelength $\lambda_0$ is 825.5 nm. Seed radiation with such a short wavelength could be brought to the emission energy required for geodetic LIDARs by means of a crystal amplifier. A Fabry-Perot seed laser diode at a wavelength of 1500 nm combined with an Er-doped fiber amplifier (EDFA) is more in accordance with the invention. Firstly, a 1500 nm FP laser diode typically has at least 20 laser modes and EDFAs are cost-effective. In such an arrangement, a contrast reduction to CON <25% is to be expected.

Figure 9B:
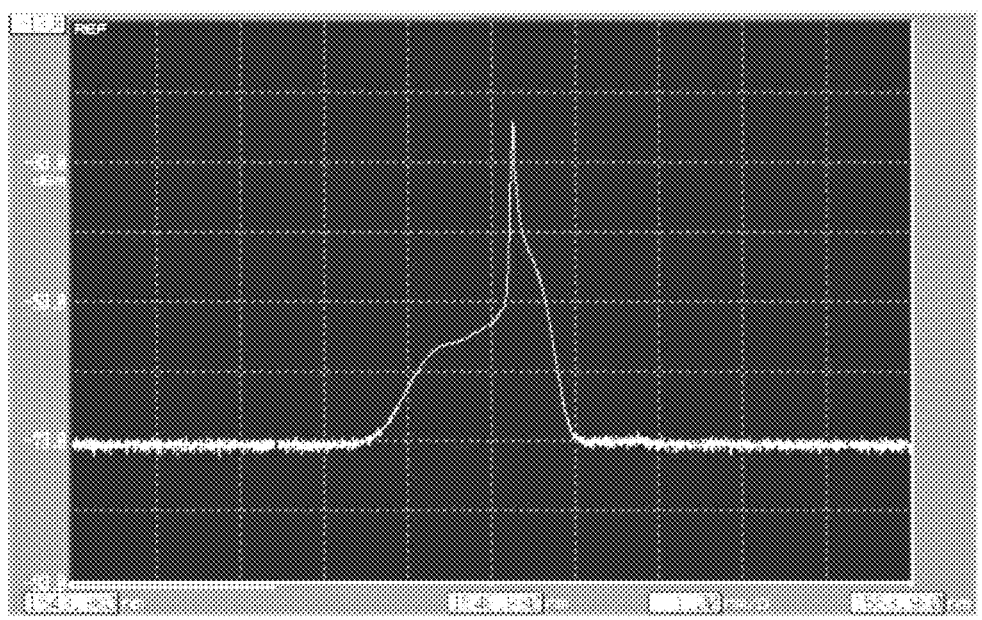
FIG. 9b shows, for comparison with FIG. 9a, the spectrum of a DFB laser diode in the case of a single mode emission and pulsed method of operation.

For a comparison with FIG. 9a, FIG. 9b shows the spectrum of a DFB laser diode with a single mode emission and pulsed method of operation. Plotted horizontally, i.e. depicted as "x-axis", is the measured spectral range $\lambda$ from 1543.98 nm to 1553.98 nm, and plotted perpendicular thereto, i.e. depicted as "y-axis", is the measured relative intensity. The emission wavelength identifiable by the peak is approximately 1549 nm.

Fiber amplifiers are generally operated with a DFB laser diode as "seed laser" in order to suppress the amplified spontaneous emission to the best possible extent. However, DFB lasers are disadvantageous in that they generate a strong speckle contrast. Therefore, according to the model according to the invention, it is preferable to use a seed source with a spectrally broadband emission.

Figure 9C:
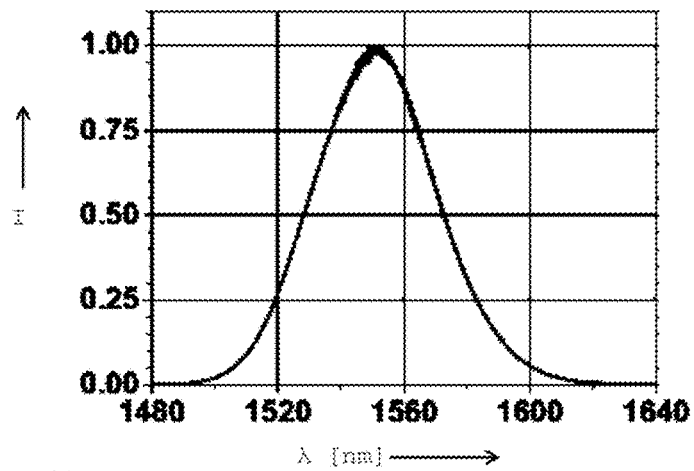
FIG. 9c shows the spectrum of an SLD diode, as a constituent of a light source for a rangefinder according to the invention, with a broadband emission without spectral lines, in the case of a pulsed method of operation.

FIG. 9c shows the spectrum of an SLD diode, as a constituent of a light source for a rangefinder according to the invention, with a broadband emission without spectral lines, in the case of a pulsed method of operation. Depicted here is the relative intensity I, normalized to 1 at the maximum, in arbitrary units a.u., as a function of the wavelength $\lambda$, measured in nanometers nm. This light source (SLD) for a distance measuring device according to the invention has a continuous and broad spectrum with a width of at least 5 nm and at most 50 nm. The emitted central wavelength is approximately 1550 nm (SLD-761-HP2-SM-1550). So that the optically modulated signal is sufficiently strong, the SLD is combined with an optical amplifier, preferably with an EFDA.

Figure 10:
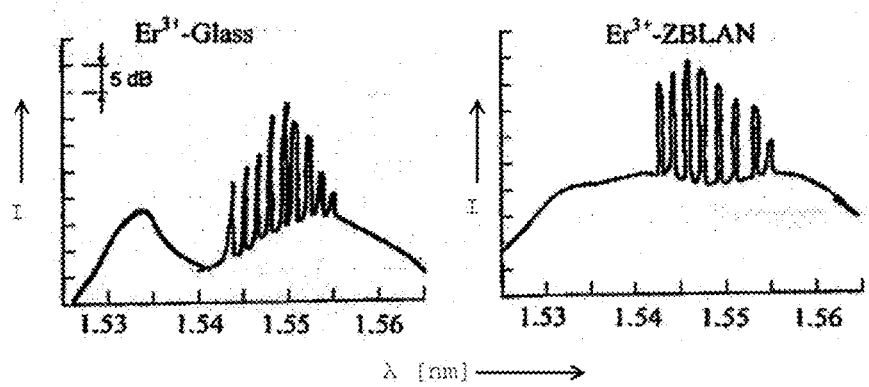
FIG. 10 shows the spectral emission profile of a signal with a multimodal laser diode downstream of a fiber amplifier, based on $Er^{3+}$ glass (left) and $Er^{3+}$ ZBLAN (right), after a single passage of the seed light from the laser diode through the amplifier.

FIG. 10 shows the spectral emission profile of a signal with a spectrally multimodal laser diode downstream of a fiber amplifier, based on $Er^{3+}$ glass (left) and $Er^{3+}$ ZBLAN (right), after a single passage of the seed light from the seed source through the amplifier. The continuous curve placed under the line spectrum shows an "ASE" ("ASE"=amplified spontaneous emission of the amplifier) spectrum. The fiber amplifier employed here is equipped without an ASE band-stop filter. Usually, an optical band-pass filter is also inserted into the beam path, said band-pass filter merely allowing the spectral range of the line spectrum to be emitted.

Figure 11:
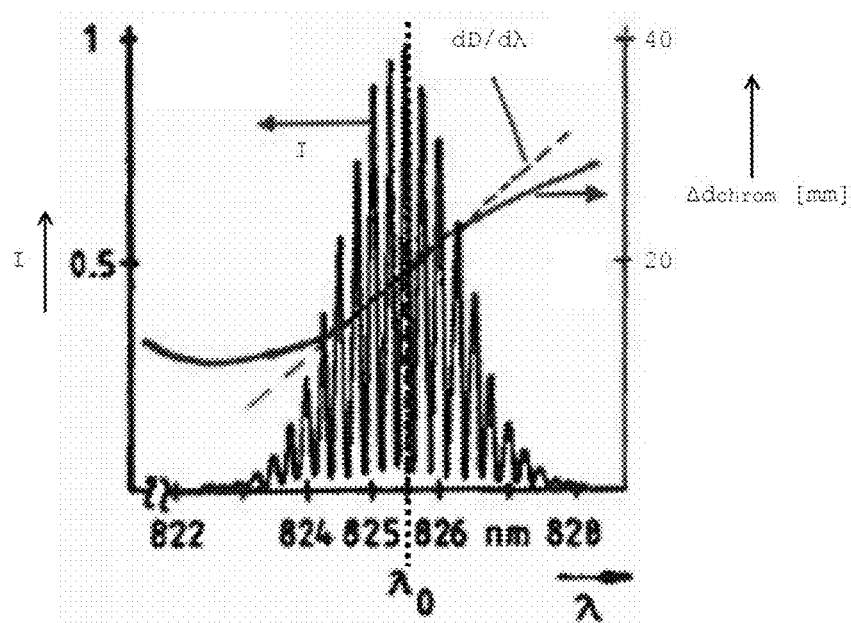

FIG. 11 depicts the so-called "chromatic delay $\Delta dchrom$" or "chromatic distance offset", measured in millimeters mm, of a modulated light source as a mechanism for the generation of "bumpy surfaces" with a light source, the spectrum of which was depicted in an exemplary manner in FIG. 5a. The "chromatic delay $\Delta dchrom$" or "chromatic distance offset" generates the apparent height differences, i.e. the apparent waviness or roughness, of a measured surface which is reflected in the derived result of a distance measurement as a result of the influence of the speckles.

Expressed more precisely: "chromatic delay" describes the wavelength-dependent time-of-flight of a light pulse. Since wavelengths are assigned to the speckles and a specific distance offset is, in turn, assigned to each wavelength, each speckle field generates an inherent measurement distance. The intensities connected to the speckle patterns, which impinge on the distance measurement receiver, are stochastically distributed and vary depending on surface and distance; this leads to measured apparent distance variations when moving the laser beam over the object to be scanned.

Distance values with deviations are measured when scanning the laser beam over the object surface to be measured.

The deviations are correlated with the transverse extent of the laser spot.

Therefore, the wave-like distance deviations at measured surfaces (i.e. in the measurement data) are generated by means of the chromatic delay and the respective speckle distribution.

The "chromatic delay" of semiconductor laser diodes and of superluminescent diodes (SLDs) can on average be significantly reduced by way of a so-called burst modulation. Here, it is not a single light pulse that is emitted in the nanosecond range, but rather a whole pulse train within the same period of time. This requires a special electronic actuation, which is implementable by means of chip-on-board technology.

Figure 12:
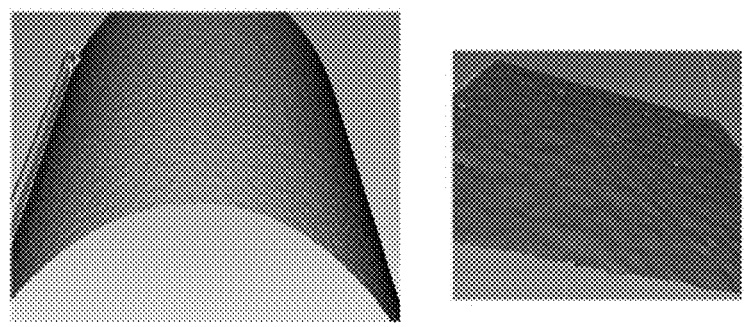
FIG. 12 shows an illustration for clarifying the problem of a supposed measured surface roughness (bumpy surface) induced by speckles on the basis of two examples of surfaces scanned by a DFB laser.

FIG. 12 clarifies the problem of a supposed measured surface roughness or waviness induced by speckles on the basis of two examples of surfaces scanned by a DFB laser; shown on the left is a curved surface of an object in the style of a pipe, and on the right is a plane surface. The surfaces show a bright/dark pattern ("inhomogeneous intensity") and a roughness that does not correspond to the actual condition of the surface.

Figure 13:
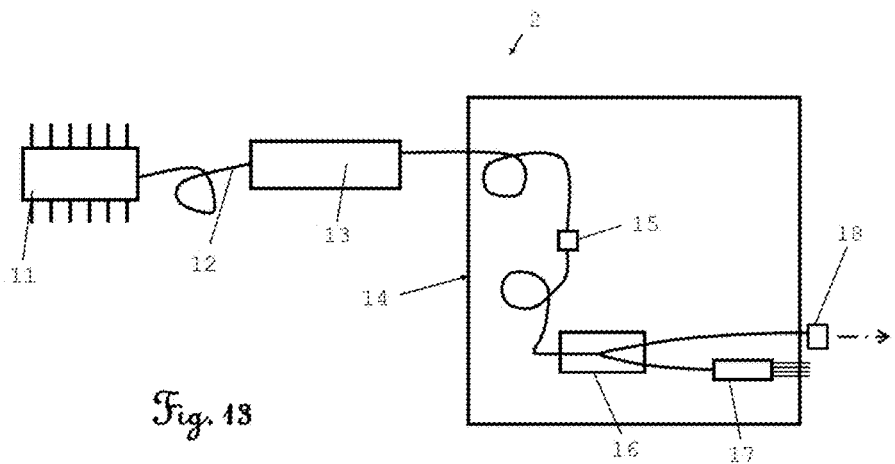
FIG. 13 shows a schematic diagram of a light source according to the invention for a rangefinder according to the invention, comprising an SLD as a primary light source and an optical amplifier disposed downstream of the SLD in the optical path.

FIG. 13 shows a schematic diagram of an exemplary embodiment of light emission means 2 according to the invention for a distance measuring device, comprising an SLD as a primary light source 11 and an optical amplifier 14 disposed downstream of the SLD in the optical path (and "seeded" by the SLD, i.e. an "SLD seeded optical amplifier), embodied as a fiber amplifier, and therefore clarifies a first aspect of the present invention, namely the reduction of interfering influences of speckles by selecting a light source that is ideal for the use. The emission light from the SLD is fed to the fiber amplifier 14 via an optical waveguide 11 and an optical isolator 13. Said fiber amplifier for example comprises an ASE filter 15, an optical coupler 16 and a pump laser 17. The amplified light from the SLD then leaves the fiber amplifier 14 at a light source output 18, from where it is available for a distance measurement.

The optical waveguide of the fiber amplifier 14 and the subsequent output fiber 18 are generally embodied as spatial single mode optical waveguides. However, what have also become known and available in the meantime are optical waveguides which have a core diameter that is greater than the diffraction limit (large core fiber) and nevertheless generate an almost pure fundamental mode emission; this is achieved by a strongly reduced inter-mode scattering behavior and, as a result, the fiber fundamental mode is maintained over a length of up to a few meters of fiber length. The fiber core diameter can in this case lie up to approximately 3× over the mono-mode condition, which corresponds to a core radius of 15 μm in the case of a wavelength of 1.55 μm. Such "large mode field" optical waveguides are advantageous in that light can be effectively coupled into the core of the amplifier fiber, even with planar-emitting LEDs or broad stripe laser diodes. Broad stripe lasers have a multimode line spectrum with a continuous LED-like emission component lying therebelow; this effectively reduces the speckle contrast.

In addition to SLDs, other light sources with partial or lacking coherence, such as VCSELs, OLEDs, high-radiance LEDs or miniaturized gas discharge lamps, which are used e.g. in smart phones, are also suitable as primary light source 11.

Figure 14:
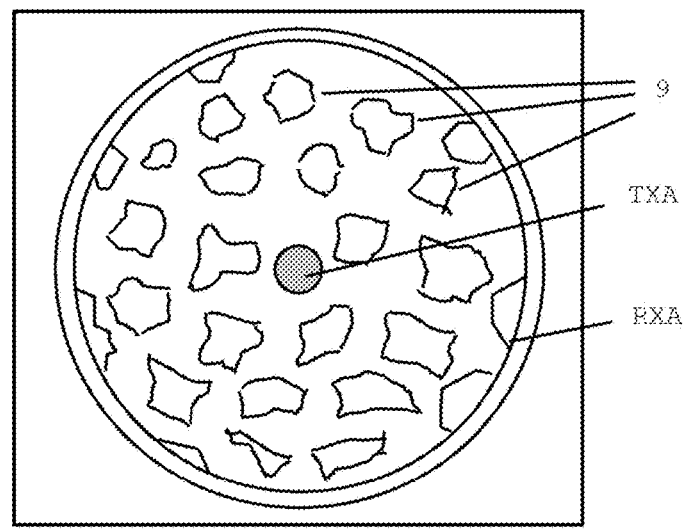
FIG. 14 shows an illustration for clarifying the reduction in the influence or contrast of the speckles by means of statistical averaging over a reception image of a reception pupil with a large extent.

FIG. 14 clarifies a second aspect of the invention, namely a reduction of the influence or the contrast by the speckles 9 by means of a statistical averaging over a reception image of a reception pupil with a large extent and with a reception aperture RXA in which a received speckle pattern induced by a polychromatic light source is received, wherein the reception aperture RXA is very much larger than the transmission aperture TXA of the light source emitting the measurement light.

In typical distance measuring devices, the mean speckle dimension approximately corresponds to the transmission aperture TXA, at least at medium and large distances. If the reception aperture RXA is designed to be substantially larger than the transmission aperture TXA such that M speckles are recorded therein, then there can be an averaging process over M speckles and the relative intensity variation is reduced by the square root of M. As a result, the speckle noise is reduced by the square root of M.

Figure 15:
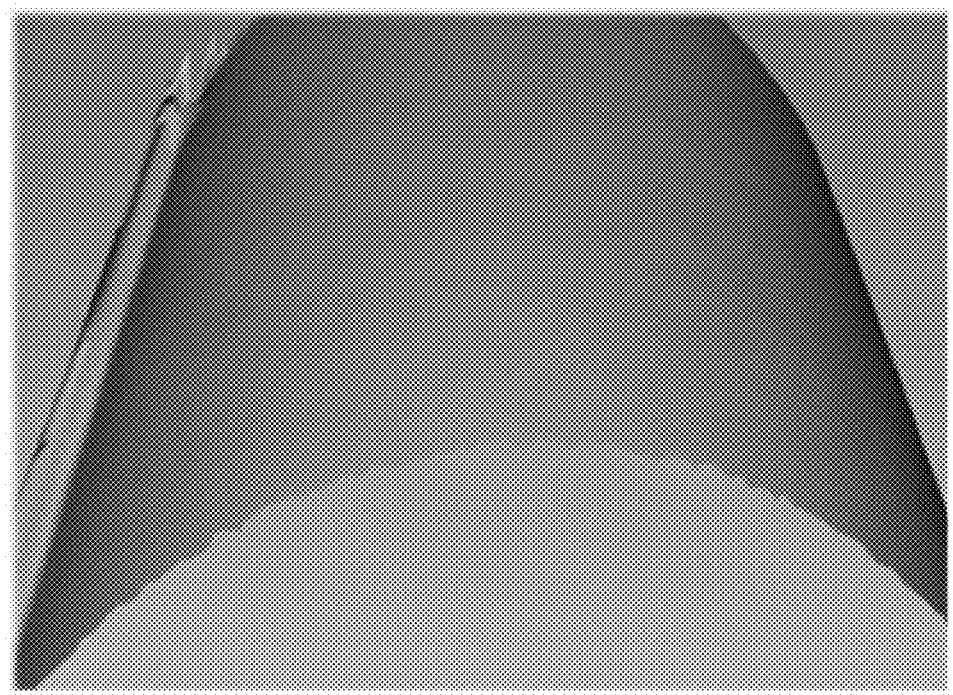
FIG. 15 shows a measurement result with, according to the invention, a broadband light source and a large aperture ratio of the reception aperture to the transmission aperture, which image should be compared to the illustration in the left half of FIG. 12.

FIG. 15 depicts a measurement result with, according to the invention, a broadband multimode laser and a large aperture ratio RXA/TXA, which image should be compared to the illustration in the left half of FIG. 12: this diagram shows the same pipe section as FIG. 12, but now, in this case, measured by a multimode laser which has a spectral width of 5 nm and consists of more than 20 modes. Both the brightness variations and the waviness of the measured surface are now significantly lower.

It is understood that these depicted figures only schematically illustrate possible exemplary embodiments. The various approaches can just as easily be combined with one another as with methods and instruments from the prior art.

What is claimed is:

1. An electro-optical rangefinder comprising:
  light emission means for emitting at least one light signal, in particular for emitting a pulsed light signal, the light emission means comprising:
    a spectrally broadband light source as primary light source, and
    an optical amplifier disposed downstream of the primary light source, in particular wherein an actively pumped medium of the optical amplifier serves as a light amplifier without a resonator, in particular wherein the optical amplifier is provided and embodied precisely to be operated with a modulation sequence with a short and/or long duty cycle;
  a receiver for detecting the light signal scattered back from a target object; and
  a control and evaluation component for determining a distance to the target object, in particular wherein the determination is based upon the pulse time-of-flight measurement method.

2. The rangefinder according to claim 1, wherein the rangefinder comprises at least one of a laser scanner, laser tracker, profiler, theodolite, and a total station.

3. The rangefinder according to claim 1, wherein:
  the primary light source is operable in a single pulse mode.

4. The rangefinder according to claim 1, wherein:
  the primary light source is operated in a burst mode.

5. The rangefinder according to claim 1, wherein:
  the primary light source is embodied as a superluminescent diode (SLD).

6. The rangefinder according to claim 1, wherein:
  the primary light source is embodied as a superluminescent diode (SLD) with a spectral emission width between 7 nm and 50 nm.

7. The rangefinder according to claim 1, wherein:
  the primary light source is embodied as a combination of a plurality of superluminescent diodes (SLDs).

8. The rangefinder according to claim 1, wherein:
  the primary light source is embodied as a high radiance LED.

9. The rangefinder according to claim 1, wherein:
the primary light source is embodied as a semiconductor laser diode which emits a plurality of modes and polychromatic light with a plurality of spectral lines.

10. The rangefinder according to claim 1, wherein:
the primary light source is embodied as a broad stripe laser diode or VCSEL (vertical cavity surface emitting laser) laser diode which emits spatially multimode and polychromatic light, in particular with a spatial emission width of between 10 µm and 300 µm.

11. The rangefinder according to claim 1, wherein:
the primary light source is embodied as a superluminescent diode (SLD) and is directly modulable by sub-nanosecond pulses.

12. The rangefinder according to claim 1, wherein:
the optical amplifier disposed downstream of the primary light source is embodied as a fiber amplifier, in particular as a glass fiber amplifier, doped with a rare earth metal such as Y, Yb, Pr, Ho, Tm, Er, or any combinations thereof.

13. The rangefinder according to claim 12, wherein:
the fiber amplifier has a fiber core diameter that is greater than the diffraction limit.

14. The rangefinder according to claim 12, wherein:
the fiber amplifier has a fiber core diameter that is greater than the diffraction limit comprising a so-called "large core" fiber.

15. The rangefinder according to claim 1, wherein:
the optical amplifier disposed downstream of the primary light source is embodied as a Raman amplifier.

16. The rangefinder according to claim 1, wherein:
the optical amplifier disposed downstream of the primary light source is embodied as an SiO2 fiber amplifier.

17. The rangefinder according to claim 1, wherein:
the optical amplifier disposed downstream of the primary light source is embodied as a semiconductor amplifier.

18. The rangefinder according to claim 1, wherein:
the optical amplifier disposed downstream of the primary light source is embodied as a semiconductor amplifier based on a material such as SOA.

19. The rangefinder according to claim 1, wherein:
the area of the reception aperture (RXA) of the receiver is at least 50 times larger than the cross-sectional area of the transmission beam.

20. The rangefinder according to claim 1, wherein:
the area of the reception aperture (RXA) of the receiver is at least 50 times greater than the cross-sectional area of the transmission beam incident on the target object.

21. The rangefinder according to claim 1, wherein:
the receiver is equipped with a reception diode comprising a plurality of segments.

22. The rangefinder according to claim 1, wherein:
the receiver comprises a reception diode having a multi-segment PIN diode or APD.

23. The rangefinder according to claim 1, wherein:
the receiver compromises an autofocus.

* * * * *